United States Patent
Mazed

(10) Patent No.: US 7,352,923 B2
(45) Date of Patent: Apr. 1, 2008

(54) BIDIRECTIONAL PHOTONIC INTEGRATED CIRCUIT-BASED SUBSYSTEM

(76) Inventor: Mohammad A. Mazed, 21520 Yorba Linda Blvd., No. 393 G, Yorba Linda, CA (US) 92887

( * ) Notice: Subject to any disclaimer, the term of this patent is extended or adjusted under 35 U.S.C. 154(b) by 21 days.

(21) Appl. No.: 11/400,452

(22) Filed: Apr. 6, 2006

(65) Prior Publication Data

US 2006/0251426 A1    Nov. 9, 2006

Related U.S. Application Data

(60) Provisional application No. 60/669,798, filed on Apr. 7, 2005.

(51) Int. Cl.
*G02B 6/12*    (2006.01)
*G02B 6/36*    (2006.01)

(52) U.S. Cl. .................... 385/14; 385/24; 385/49; 385/88; 385/89

(58) Field of Classification Search ............ 385/14, 385/24, 49, 50, 88–92
See application file for complete search history.

(56) References Cited

U.S. PATENT DOCUMENTS

| | | | |
|---|---|---|---|
| 5,031,188 A * | 7/1991 | Koch et al. | 372/50.11 |
| 5,875,274 A * | 2/1999 | Stein | 385/49 |
| 6,148,015 A * | 11/2000 | Jacquet et al. | 372/50.21 |
| 6,437,891 B1 * | 8/2002 | Chandrasekhar et al. | 398/139 |
| 7,062,114 B2 * | 6/2006 | Webjorn et al. | 385/14 |

* cited by examiner

*Primary Examiner*—Hemang Sanghavi
(74) *Attorney, Agent, or Firm*—Edward C. Kwok; McPherson Kwok Chen & Heid LLP

(57) ABSTRACT

A reconfigurable intelligent subsystem may include a bidirectional photonic integrated circuit. The bidirectional photonic integrated circuit may include a distributed reflector (DR) laser or a distributed feedback laser (DFB) that emits light of a first wavelength, and a longitudinal waveguide portion that transmits light of a second wavelength, while attenuating light of the first wavelength. The bidirectional photonic integrated circuit may be coupled to a single mode optical fiber to provide two-way optical communication between a service provider ("headend") and a subscriber.

34 Claims, 4 Drawing Sheets

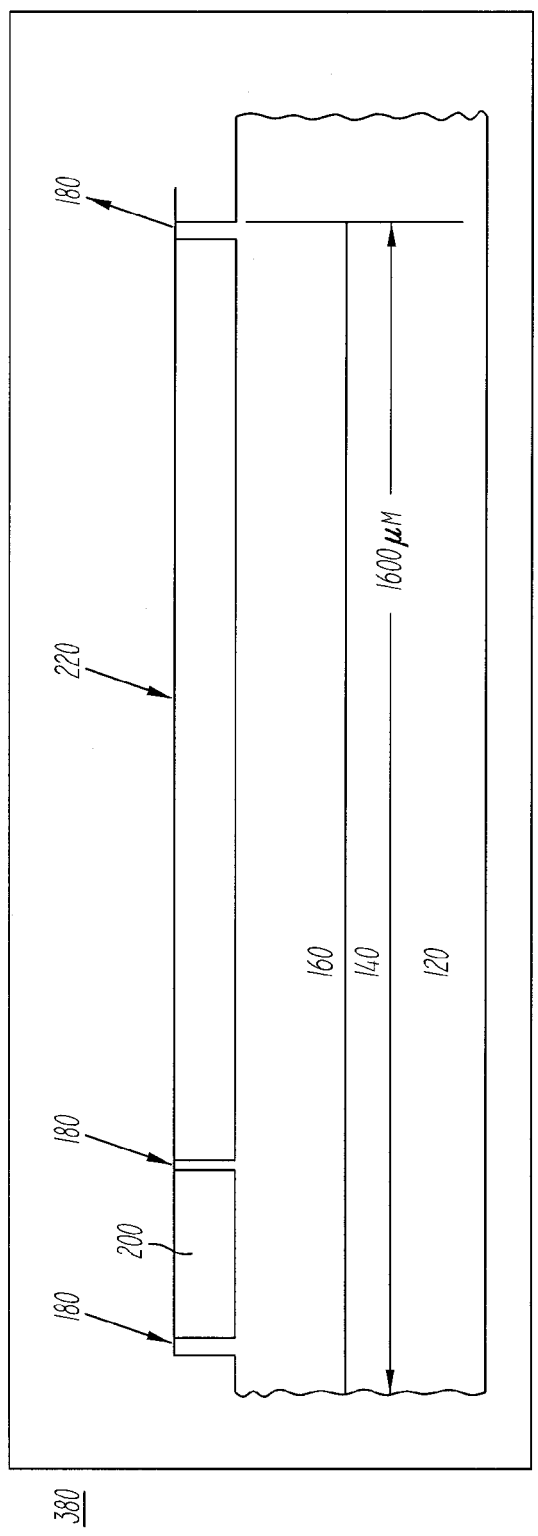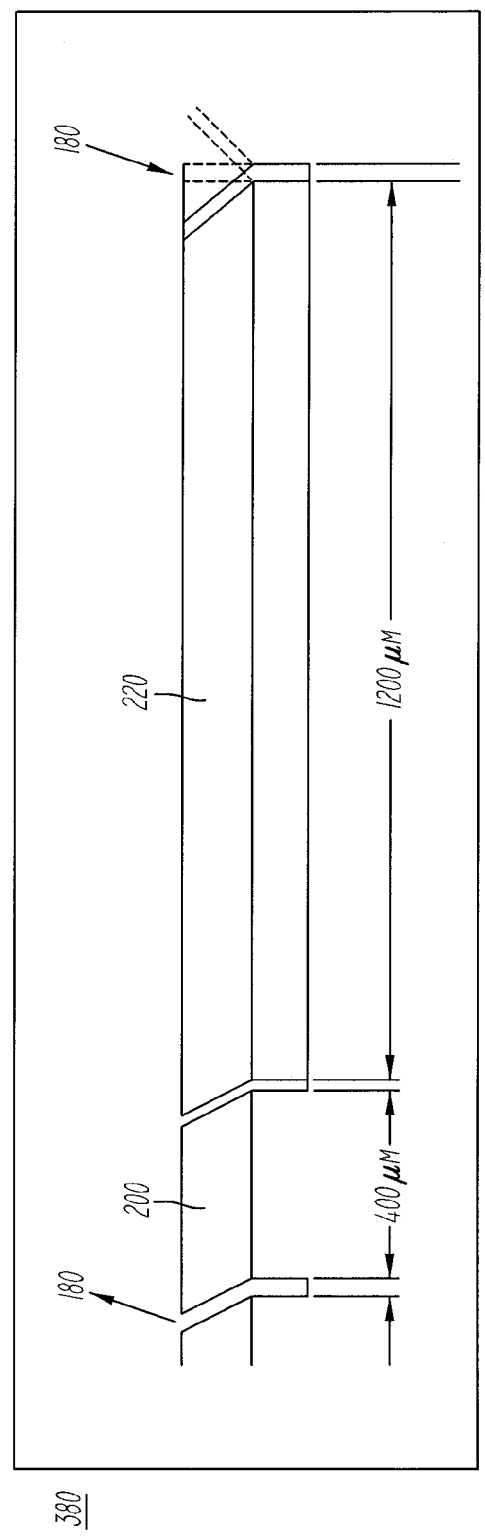

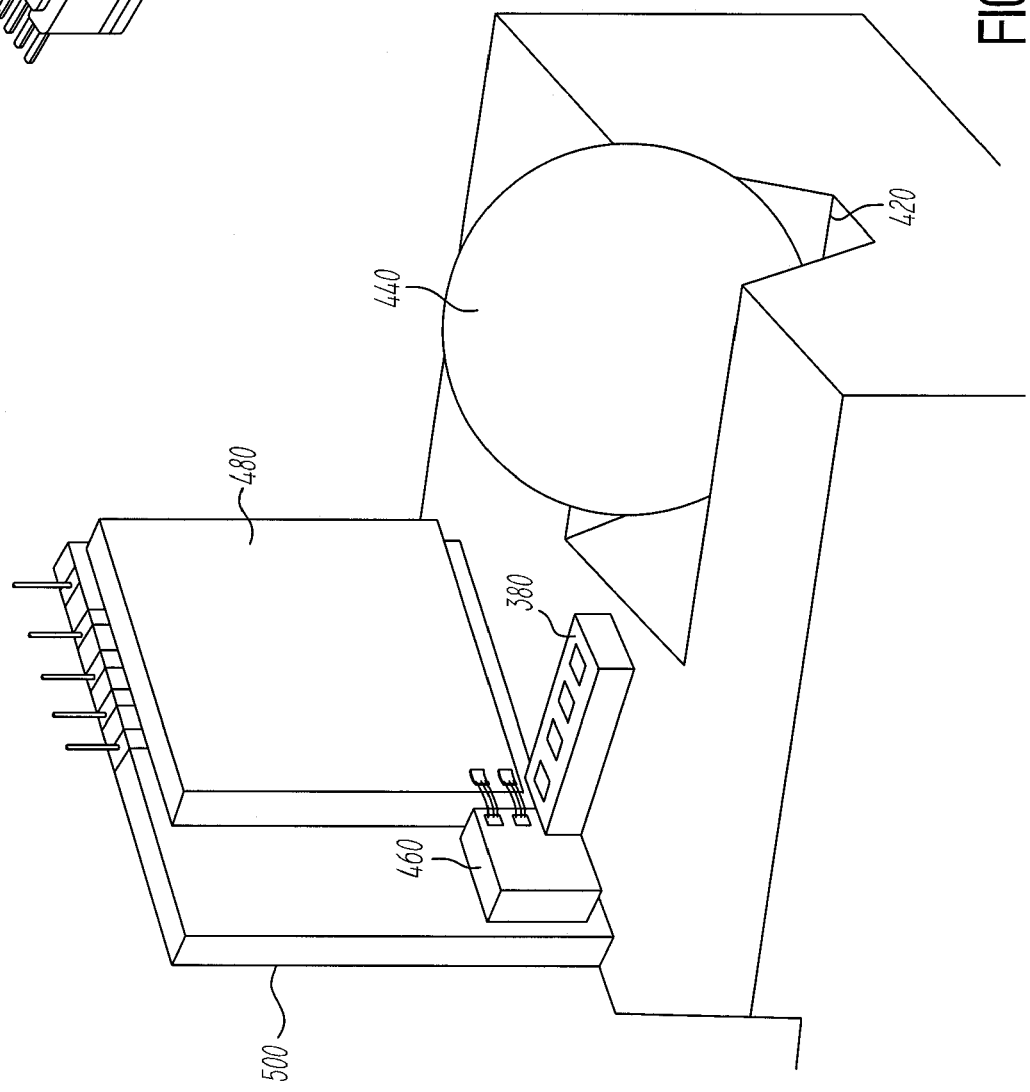

BIDIRECTIONAL PHOTONIC INTEGRATED CIRCUIT-BASED SUBSYSTEM

CROSS REFERENCE TO RELATED APPLICATION

The present application is related to and claims priority to U.S. Provisional Patent Application, entitled "Bidirectional Photonic Integrated Circuit-Based Subsystem," which was filed on Apr. 7, 2005, and assigned Ser. No. 60/669,798. The U.S. Provisional Patent Application 60/669,798 is hereby incorporated by reference in its entirety.

BACKGROUND OF THE INVENTION

Field of the Invention

The present invention relates to photonics. In particular, the present invention relates to a bidirectional photonic integrated circuit (PIC) based subsystem.

SUMMARY

According to one embodiment of the present invention, an intelligent subscriber subsystem may include a bidirectional photonic integrated circuit. The bidirectional photonic integrated circuit may include a distributed reflector (DR) laser or a distributed feedback (DFB) laser that emits light of a first wavelength, and a longitudinal waveguide portion that transmits light of a second wavelength, while attenuating backwardly propagated light of the first wavelength. The bidirectional photonic integrated circuit may be coupled to a single mode optical fiber to provide a two-way optical communication between a headend and a subscriber.

According to one embodiment of the present invention, the bidirectional photonic integrated circuit where wavelength $\lambda_1$ nm (for example 1310 nm) carry interactive commands from a subscriber to a headend and signals of wavelength $\lambda_2$ nm (for example 1550 nm) carry content from a headend to a subscriber. In one embodiment, wavelength $\lambda_1$ nm is shorter than wavelength $\lambda_2$ nm. The photonic integrated circuit integrates various optical functions on a common wafer for simpler construction, smaller size and lower cost.

The present invention is better understood upon consideration of the detailed description below and the accompanying drawings.

BRIEF DESCRIPTION OF THE DRAWINGS

FIG. 1 shows, schematically, a vertical cross-section through a structure for use in a photonic integrated circuit (PIC) 380, in accordance with one embodiment of the present invention.

FIG. 2 is a perspective view of the structure shown in FIG. 1.

FIG. 5 shows a schematic perspective view of an apparatus in one application of PIC 380, in accordance with one embodiment of the present invention.

FIG. 6 shows the apparatus of FIG. 5 encapsulated in a PIC optical module 500.

DETAILED DESCRIPTION OF THE PREFERRED EMBODIMENTS

Figure 3:
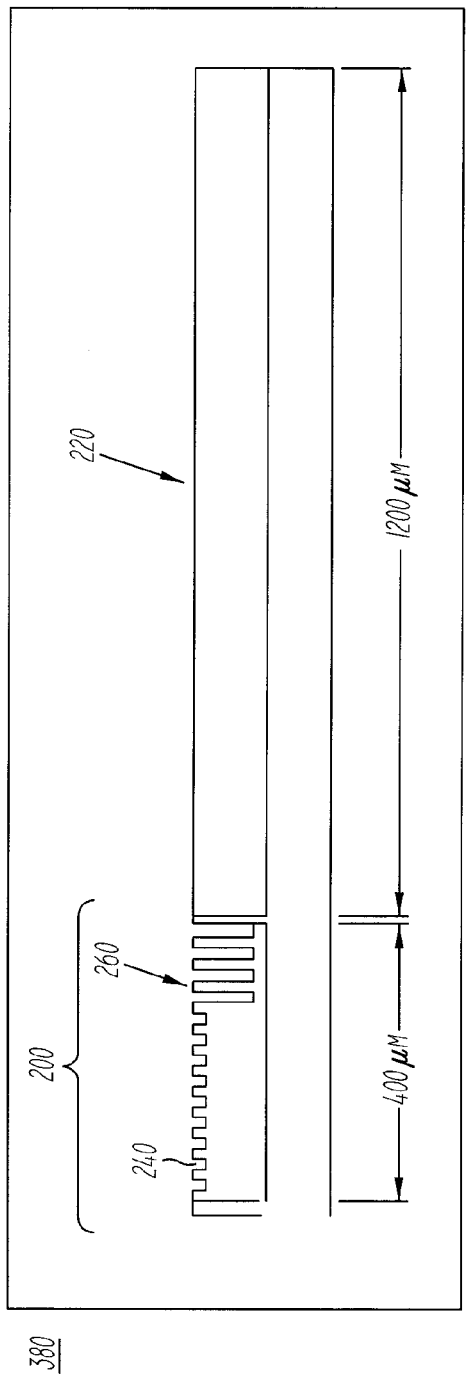
FIG. 3 shows, schematically, a vertical cross-section of the structure of FIG. 1 including gratings 240 and 260 provided in laser MQW 200 (which may be used to form a DR laser 300 with a phase control region 320, respectively, such as shown as shown in FIG. 4).

FIG. 1 shows, schematically, a vertical cross-section through a structure for use in a photonic integrated circuit (PIC), in accordance with one embodiment of the present invention. As shown in FIG. 1, the structure includes 400±10 µm of laser multiple quantum well (MQW) material 200, and 1200±10 µm of bulk or MQW waveguide material 220 (hereinafter, "bulk waveguide material 220" to simplify reference). In this embodiment, the bandgap wavelength of laser MQW material 200 is selected to be $\lambda_1$ nm and the bandgap wavelength of bulk waveguide material 220 is selected to be about $(\lambda_1 \text{ nm} + \lambda_2 \text{ nm})/2$.

Laser MQW material 200 and bulk waveguide material 220 may be formed as repeated structures separated from each other by angular etched windows 180 (as shown in FIG. 1) on a wafer. Laser MQW material 200 and bulk waveguide material 220 may be provided on a buffer layer 160, followed absorption layer 140 on a by an substrate 120.

A portion of the unprotected area of the substrate is etched away, and laser MQW 200 and waveguide 220 are selectively grown sequentially using, for example, metalorganic chemical vapor depositions (MOCVD), or any other suitable method. Windows provide oxidation-free growth of laser MQW 200 and non-absorbing interfaces for reliable laser operation. Angled windows provide localized reflection immunity. Laser MQW material 200 typically includes InAlGaAs or InGaAsP material. Bulk waveguide material typically includes InGaAsP. Electrical contacts may be made onto these structures by providing a contact layer, typically formed using a p+ InGaAs contact material. Substrate 120, absorption layer 140, buffer layer 160 and cladding layers are typically InP material. The structure is fabricated at an approximate 7-degree angle with respect to the major cleavage crystal planes of the semiconductor material to reduce localized reflection. Absorption layer 140 absorbs substrate-induced stray light of wavelength $\lambda_1$ nm.

Figure 4:
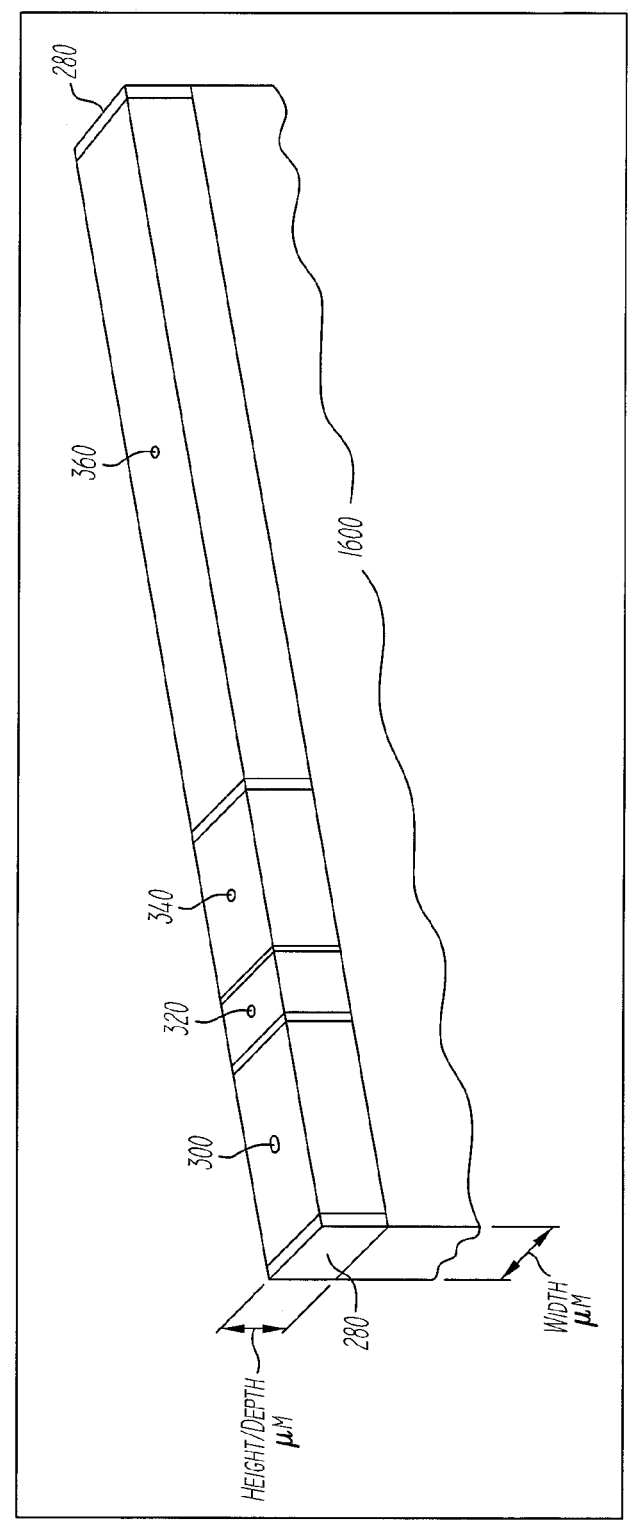
FIG. 4 shows, in a schematical perspective view of PIC 380, a directly modulated DR laser 300 with a phase control region 320, a reversed biased monitor photodiode 340 and a transmission region 360, in accordance with one embodiment of the present invention.

FIG. 2 is a perspective view of the structure shown in FIG. 1. In one embodiment, laser MQW material 200 is fabricated into a distributed reflector (DR) laser and bulk waveguide material 200 forms a waveguide that preferentially transmits light of wavelength $\lambda_2$ nm. Therefore, FIG. 3 shows, schematically, a vertical cross-section of the structure of FIG. 1 including gratings 240 and 260 provided in laser MQW material 200 (which may be used to form DR laser 300 and a phase control region 320, respectively, such as shown in FIG. 4).

A DR laser may be implemented using shallow etched gratings 240 and deeply etched gratings 260. Gratings 260 function both as a phase control region and a reflector region for wavelength $\lambda_1$ nm as to obtain a higher front output power, a higher slope efficiency and a narrower linewidth. Gratings 240 and 260 are either uniform or phase-shifted. Gratings 240 and 260 may have different pitches, different waveguide widths, tapered profiles, or curvatures, or mixture of tapered profiles and curvatures so as to have refractive index differences. Gratings may have near-perfect pitches to allow precise control of the emission wavelength ($\lambda_1$ nm) by utilizing an additional thermo electrical cooler (TEC). Care should be taken to prepare the grating surfaces, prior to carrying out any material regrowth by MOCVD or any other suitable method.

The difference $\Delta$ nm between the bandgap wavelengths of laser MQW material 200 and bulk waveguide material 220 may be selected based on the relative change of the emission wavelength ($\lambda_1$ nm) per ° C., the gain curve shift of laser MQW material 200 per ° C. and the gain curve shift of bulk waveguide material 200 per ° C. with respect to entire operating temperature range of the PIC 380.

Typically, a DR laser or a distributed feedback (DFB) laser includes either a buried hetrostructure (BH) or a ridge waveguide (RW) as a longitudinal device structure. In a BH longitudinal structure, a suitable active width may be about 1.4±0.10 µm, with a height or depth of about 2.75±0.05 µm. In a ridge waveguide longitudinal structure, a suitable ridge width may be about 2±0.10 µm, with a height or depth of 1.75±0.05 µm.

As mentioned above, the structure of FIG. 3 can be used to build a PIC 380. FIG. 4 shows, in a schematical perspective view of PIC 380, directly modulated DR laser 300 with a phase control region 320, reversed biased monitor photodiode 340 and transmission region 360. A transmission region 360 also simultaneously absorbs light of wavelength $\lambda_1$ nm (under reversed bias) and transmits light of wavelength $\lambda_2$ nm at a lower loss. DR laser 300 and its phase control region 320 corresponds to gratings regions 240 and 260 in laser MQW material 200. In this embodiment, a reversed bias monitor photodiode 340 is formed in an electrically isolated 250-µm region of bulk waveguide material 220. A reversed bias monitor photodiode 340, which measures a photo current in the microampere range, is provided to allow a conventional laser driver integrated circuit with controlled feedback circuitry to be used with PIC 380. A reversed biased monitor photodiode 340 is sufficiently electrically isolated to monitor back output power, which is proportional to front output of DR laser 300.

Each of the cleaved end facets of PIC 380 is provided with a single layer or multiple layers of anti-reflective (AR) coating of about 0.1% in a suitable wavelength range. Thus, as shown in FIG. 4, PIC 380 is about 1600±10 µm in length, 400±10 µm in width, and 120±10 µm in thickness to facilitate cleaving, handling and mounting.

As shown in FIG. 4, PIC 380 provides four control electrodes: an electrode for direct modulation to a laser 300 (about 350 microns in length), an electrode for phase control region 320 (about 50 microns in length—required only for a DR laser), an electrode for monitor photodiode 340 (about 250 microns in length), and an electrode for section 360 (950 micron in length).

Additional electrodes may be provided to achieve further electrical isolation between monitor photodiode 340 and laser 300, and for switching, varying or tuning wavelength around $\lambda_1$ nm.

Direct modulation bandwidth and chirp of laser 300 may be improved by incorporating quantum dots in laser MQW material 200. The material gain profile and operating temperature range can be increased by incorporating quantum dots in both laser MQW material 200 and bulk waveguide material 220.

In addition, PIC 380 may also include a thin-film resistor (on top) which is isolated by a thermally conducting, but electrically non-conducting insulator material from the top electrodes. The thin-film resistor allows fast heating (e.g., about 50 milliseconds) upon an initial cold start.

In one embodiment of the present invention, a gain-coupled directly modulated DFB laser may be formed by carefully etching through laser MQW material 200. Extreme care should be taken to prepare the laser MQW material 200 grating surfaces, prior to carrying out any material regrowth by MOCVD or any other suitable method.

An exemplary structure for forming a $\lambda_1$=1310 nm emission wavelength index-coupled directly modulated DR laser (or index- or gain-coupled directly modulated DFB laser) on n+ InP substrate 120 is given below in Table 1. Table 1 shows, for each layer from the top surface, the layer's purpose, composition, thickness, dopant type and concentration, and layer strain. As set forth in Table 1, the structure includes 6 quantum wells and 7 quantum barriers. The figures provided in Table 1 are provided merely for illustrative purposes. In any implementation, the actual number of quantum wells and barriers, or any other layers, thicknesses, dopant concentrations, and the amounts and polarities of strains are tuned to achieve the specification of a desired laser. In general, any structure that includes multiple quantum wells and quantum barriers in the active layers may be used to practice this invention.

TABLE 1

| Layer | Composition | Thickness (nm) | Doping ($10^{18}$/cm$^3$) | Strain (%) |
|---|---|---|---|---|
| Contact | $In_{0.53}Ga_{0.47}As$ (1657 nm) | 200 | Zn: >30 | 0.0 |
| Contact | $In_{0.60}Ga_{0.40}As_{0.87}P_{0.13}$ (1520 nm) | 25 | Zn: 5.0 | 0.0 |
| Contact | $In_{0.72}Ga_{0.28}As_{0.61}P_{0.39}$ (1300 nm) | 25 | Zn: 3.0 | 0.0 |
| Cladding | InP (918.6 nm) | 1500 | Zn: 0.7-2.0 | 0.0 |
| Etching-Stop | $In_{0.89}Ga_{0.11}As_{0.24}P_{0.76}$ (1050 nm) | 10.5 | Zn: 0.5 | 0.0 |
| Spacer | InP (918.6 nm) | 140 | Zn: 0.5 | 0.0 |
| *Protection | $In_{0.53}Ga_{0.47}As$ (1657 nm) | 20 | Zn: 0.3 | 0.0 |
| *Protection | InP (918.6 nm) | 10 | Zn: 0.3 | 0.0 |
| ***Waveguide | $In_{0.75}Ga_{0.25}As_{0.54}P_{0.46}$ (1250 nm) | 40 | Zn: 0.3 | 0.0 |
| Spacer | InP (918.6 nm) | 40 | Zn: 0.3 | 0.0 |
| Blocking | $In_{0.52}Al_{0.48}As$ (834 nm) | 80 | Zn: 0.3 | 0.0 |
| GRIN-SCH | $In_{1-x-y}Al_xGa_yAs$ x/y = 0.35/0.13 – 0.38/0.09 (1000 nm – 950 nm) | 50 | Undoped | 0.0 |
| Barrier | $In_{0.52}Al_{0.35}Ga_{0.13}As$ (1000 nm) | 8.5 | Undoped | 0.0 |
| *Well-6 | $In_{0.74}Al_{0.18}Ga_{0.08}As$ (1390 nm) | 5 | Undoped | Compressive strain (CS) 1.5 |
| Barrier | $In_{0.52}Al_{0.35}Ga_{0.13}As$ (1000 nm) | 8.5 | Undoped | 0.0 |
| *Well-5 | $In_{0.74}Al_{0.18}Ga_{0.08}As$ (1390 nm) | 5 | Undoped | CS1.5 |
| Barrier | $In_{0.52}Al_{0.35}Ga_{0.13}As$ (1000 nm) | 8.5 | Undoped | 0.0 |

TABLE 1-continued

| Layer | Composition | Thickness (nm) | Doping ($10^{18}/cm^3$) | Strain (%) |
|---|---|---|---|---|
| *Well-4 | $In_{0.74}Al_{0.18}Ga_{0.08}As$ (1390 nm) | 5 | Undoped | CS1.5 |
| Barrier | $In_{0.52}Al_{0.35}Ga_{0.13}As$ (1000 nm) | 8.5 | Undoped | 0.0 |
| *Well-3 | $In_{0.74}Al_{0.18}Ga_{0.08}As$ (1390 nm) | 5 | Undoped | CS1.5 |
| Barrier | $In_{0.52}Al_{0.35}Ga_{0.13}As$ (1000 nm) | 8.5 | Undoped | 0.0 |
| *Well-2 | $In_{0.74}Al_{0.18}Ga_{0.08}As$ (1390 nm) | 5 | Undoped | CS1.5 |
| Barrier | $In_{0.52}Al_{0.35}Ga_{0.13}As$ (1000 nm) | 8.5 | Undoped | 0.0 |
| *Well-1 | $In_{0.74}Al_{0.18}Ga_{0.08}As$ (1390 nm) | 5 | Undoped | CS1.5 |
| Barrier | $In_{0.52}Al_{0.35}Ga_{0.13}As$ (1000 nm) | 8.5 | Undoped | 0.0 |
| GRIN-SCH | $In_{1-x-y}Al_xGa_yAs$ x/y = 0.38/0.09 – 0.35/0.13 (950 nm – 1000 nm) | 100 | Undoped | 0.0 |
| Blocking | $In_{0.52}Al_{0.48}As$ (834 nm) | 50 | Si: 2.0-0.8 | 0.0 |
| Buffer | InP | 800 | Si: 1.0 | 0.0 |
| Substrate | InP (100) | — | Si: 3.0 | 0.0 |

*Photoluminescence (PL) peak position at room temperature: (1300 ± 5) nm, across the wafer ±2 nm FIG. 5 shows a schematic perspective view of an apparatus in one application of PIC 380, in accordance with one embodiment of the present invention. As shown in FIG. 5, the apparatus includes a PIC 380, a single-mode optical fiber 400 (hereinafter, "optical fiber 400" to simplify reference), lens 440 and back-illuminated lensed avalanche photo-diode (APD) with a thin film cut off or band bass filter 460, and trans-impedance amplifier (TIA) 480. As shown in FIG. 5, lens 440 and optical fiber 400 are affixed in a V-groove 420. Optical fiber 400 may be a nominal single-mode optical fiber or a large numerical aperture thermally expanded core single-mode optical fiber 400. The apparatus of FIG. 5 may be encapsulated in a PIC optical module 500 in a ceramic-metal package, for example, as shown in FIG. 6. For example, the components of FIG. 5 may be packaged into 12-pin hermetic ceramic-metal, surface-mount, butterfly or TO can-style PIC optical module 500.

In one application, optical fiber 400 runs from a head end (i.e., equipment on the service provider side) and connects to PIC optical module 500, located at a subscriber. In that application, modulated light signals (from subscriber) of wavelength $\lambda_1$ nm are transmitted through anti-reflection coated ball lens 440 (or any other suitable lens) into optical fiber 400. Lens 440 is affixed into V-groove 420, which is etched out of a silicon or ceramic material. A suitable material for forming V-groove 420 supports mechanically, electrically and thermally the components residing on V-groove and can be precisely etched or shaped. At the same time, modulated signals (from the head end) of wavelength $\lambda_2$ nm are transmitted in a single-mode optical fiber 400, and are received into PIC module 500 through a lens 440 and PIC 380, and detected by a back-illuminated APD or a PIN photodiode 460. A back-illuminated APD or PIN photodiode 460 may be integrated with an etched or shaped focusing microlens and a thin-film cut-off or bandpass filter. Such an APD or a PIN photodiode 460 may be closely mounted and connected to a TIA integrated circuit 480. As shown in FIG. 5, APD or PIN photodiode 460 and a TIA integrated circuit 480 may be provided in a common assembly substrate or platform with an edge wrap metallization, which may be provided on another substrate or as a part of PIC optical module 500.

In the application of FIG. 5, unwanted backward propagated light of wavelength $\lambda_1$ nm from PIC 380 may cause erroneous signals at an APD or a PIN photodiode 460. Therefore, under reversed-biased condition, waveguide section 360 absorbs backward propagated light of wavelength $\lambda_1$ nm and prevents transmission of the wavelength $\lambda_1$ nm light from reaching back-end facet 280, which faces APD or PIN photodiode 460. The amount of absorbed $\lambda_1$ nm light may be increased by increasing the length of waveguide section 360.

An APD or PIN photodiode 460 and a TIA integrated circuit 480 may be provided in a common assembly substrate or platform with an edge wrap metallization.

When assembling the components of FIG. 5, side steps may be etched onto a PIC 380, such that they match accurately with the side steps of V-groove 420. PIC 380 may be mounted in either a "substrate-down" configuration, or a "substrate-up" configuration, as long as the signal path vertical distance is "actively in-situ positioned" for a maximum TIA sensitivity.

For a "substrate up" configuration, all vertical epitaxy layer thicknesses may be precisely controlled using a MOCVD method, or any other suitable growth method. Consequently, very high precision control of the emission distance or emission point can be achieved, thus facilitating positioning of the other components.

To minimize reflection back into laser 300 of PIC 380, single-mode fiber 400's tip is fabricated at an approximately 12 degree angle, and with an anti-reflection coating of 0.1% in the suitable wavelength range. Optical fiber 400 may be fixed in place by either a rigid pigtailed or a flexible detachable receptacle.

PIC 380 can be coupled to an input arm of a 1×2 optical switch. The output arms of a 1×2 optical switch may be coupled to two separate single-mode optical fibers. In such a configuration, signals may be routed through a standby single-mode optical fiber when a cut occurs in the other optical fiber.

Figure 7:
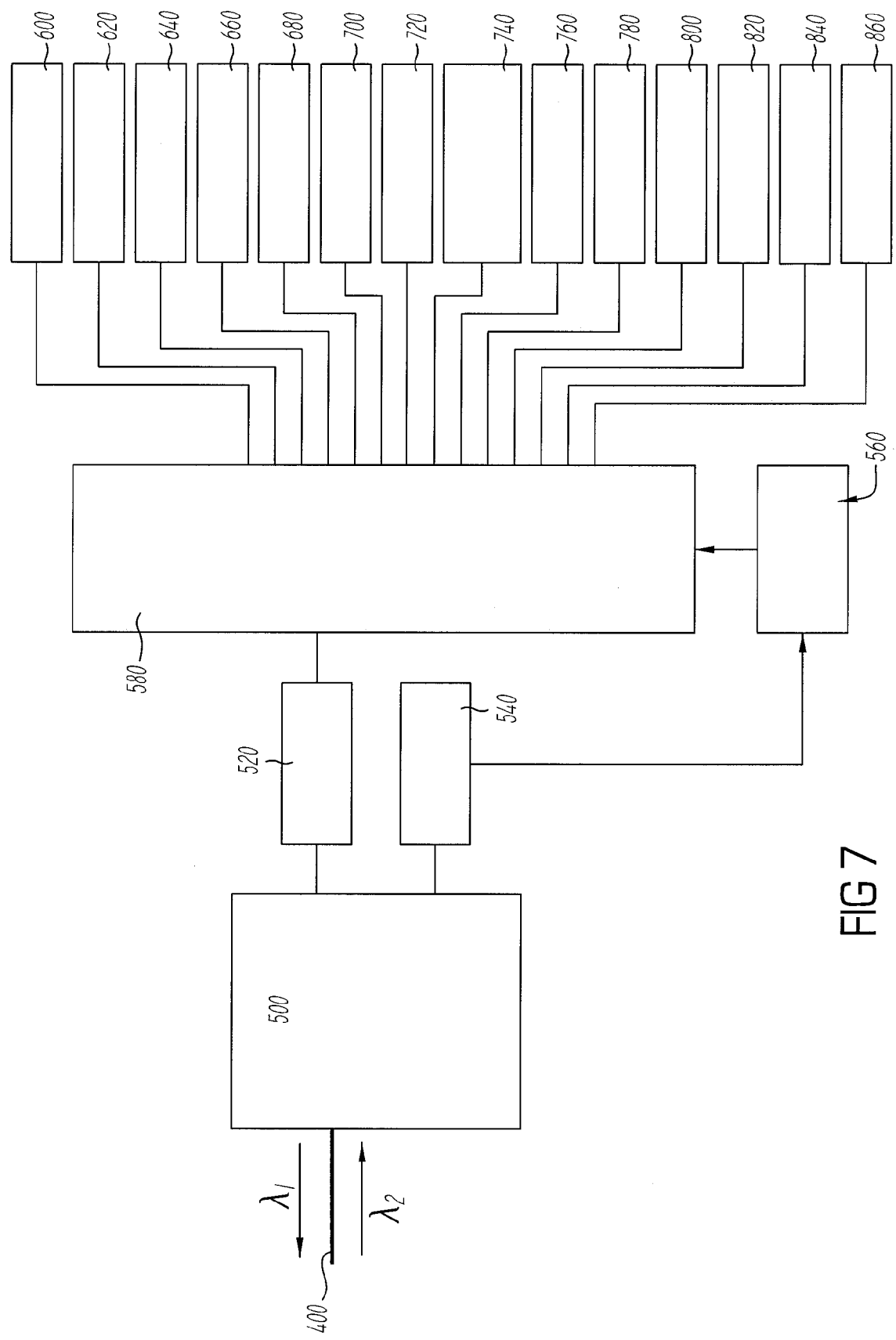
FIG. 7 is a block diagram of a subscriber communication subsystem in which PIC optical module 500 may be used.

FIG. 7 is a block diagram of a communication subsystem in which PIC optical module 500 may be used. As shown in FIG. 7, PIC optical module 500 is shown driven by laser driver 520 to provide data output modulated at wavelength $\lambda_1$ nm. Limiting amplifier 540 receives the data input that PIC optical module 500 receives from signals modulated at $\lambda_2$ nm on optical fiber. Clock and data recovery circuit 560 then recovers data and clock signals from the amplified output signal of limiting amplifier 540. The clock and data signals are then fed into FPGA with a processor 580, which may be implemented, for example by a system-on-a chip implementation.

FPGA with a processor 580 interacts with various hardware or software modules to perform numerous communication functions. For example, security functions may be carried out by authentication module 600, in-situ real-time diagnostic module 620, Internet firewall device 640, and Internet spyware firewall device 660. Communication functions may be carried out by plain old telephony service (POTS) 680, voice over IP service 700, data over IP 720, communication over wireless (including a millimeter wave wireless) service 740, communication over coaxial cable 760, and communication over Cat 5/6 service 780.

In addition, multimedia services, such as video over IP to regular TV converter 800, set top box 820, video recorder 840 and T-1 860 or other smart home connections can also be provided. Most of the above circuit functions can be integrated into one or two application specific integrated circuits.

The detailed description above is provided to illustrate the specific embodiments of the present invention and is not intended to be limiting. Many modifications and variations within the scope of the present invention are possible. The present invention is set forth in the following claims.

I claim:

1. A subsystem, comprising:
   a receptacle for an optical fiber;
   a photonic integrated circuit including a waveguide, the photonic integrated circuit transmitting in the optical fiber an optical signal of a first wavelength and receiving from the optical fiber an optical signal of a second wavelength; and
   a standalone photodiode, wherein the standalone photodiode and the photonic integrated circuit are encapsulated inside an optical module such that the photodiode is positioned adjacent to one end of the photonic integrated circuit at an angle relative to a direction of light transmission in the waveguide to receive from the waveguide the optical signal of the second wavelength.

2. A subsystem as in claim 1, wherein substrate-induced reflection is reduced by an absorbing layer.

3. A subsystem as in claim 1, wherein the photonic integrated circuit comprises a laser selected from a group consisting of a laser, a precision wavelength laser, a variable wavelength laser, a quantum dot based precision wavelength laser and a quantum dot based variable wavelength laser.

4. A subsystem as in claim 1, wherein the photonic integrated circuit comprises a waveguide selected from a group consisting of a bulk waveguide and a quantum dot based waveguide.

5. A subsystem as in claim 1, wherein the waveguide is angled relative to the facets at the ends of the photonic integrated circuit.

6. A subsystem as in claim 1, wherein the waveguide is formed by a growth process within a window.

7. A subsystem as in claim 1, wherein the waveguide includes one or more tapered sections towards a front output facet.

8. A subsystem as in claim 1 where the waveguide includes one or more curved sections towards a front output facet.

9. A subsystem as in claim 1 where the waveguide includes one or more tapered and curved sections towards a front output facet.

10. A subsystem as in claim 6, wherein the window is angled to reduce reflection.

11. A subsystem as in claim 1, wherein the photonic integrated circuit includes various individual functional components fabricated over a substrate using sequential selective area growth in an angled window.

12. A subsystem as in claim 11, wherein the window is angled to reduce material oxidation.

13. A subsystem as in claim 1, wherein the standalone photodiode with a thin-film filter is back-illuminated.

14. A subsystem as in claim 1, wherein the photonic integrated circuit is fabricated alloys of InGaAsP/InP or InAlGaAs/InP via metlorganic chemical vapor deposition (MOCVD).

15. A subsystem as in claim 1, further comprising a set of connectivity integrated circuits including a security related integrated circuit.

16. A subsystem as in claim 15, wherein the security related integrated circuit is selected from a group consisting of: an authentication module, an in-situ diagnostic module, an Internet firewall, and an Internet spy ware firewall.

17. A subsystem as in claim 15, wherein the connectivity integrated circuits provide services selected from a group consisting of: plane old telephony service, a voice over IP, a data over IP, a video over IP, and a T-1 data.

18. A subsystem as in claim 17, further comprising smart home connectivity devices.

19. A subsystem as in claim 17, further comprising a multimedia device.

20. A subsystem as in claim 19, the multimedia device is selected from the group consisting of: video over IP to regular TV converter, a set top box, and a video recorder.

21. A subsystem as in claim 17, further comprising a data distribution device.

22. A subsystem as in claim 21, wherein the data distribution device comprises devices selected from the group consisting of devices for controlling communication over coaxial cables, and devices for controlling communication over Cat 5/6 cables.

23. A subsystem as in claim 21, wherein the data distribution device comprises a wireless device.

24. A subsystem as in claim 23, wherein the wireless data distribution device comprises a millimeter-wave device.

25. A subsystem as in claim 1, further comprising an optical switch.

26. A subsystem as in claim 1, further comprising a thin-film resistor.

27. A subsystem as in claim 1, wherein the standalone photodiode is positioned such that the angle is substantially 90 degrees.

28. A optical package comprising:
    a first substrate for mounting a photonic integrated circuit, the photonic integrated circuit including a laser and a waveguide for providing laser energy to an optical fiber and for receiving laser energy from the optical fiber;
    a second substrate for mounting a standalone back-illuminated photodiode, the second substrate being positioned in the optical package in a substantially orthogonal orientation to the first substrate to allow the photodiode to detect the laser energy received from the external fiber; and
    signal processing circuits mounted on the second substrate for processing laser energy detected by the photodiode.

29. An optical package as in claim 28, wherein the first and second substrates are assembled by vertical edge wrap.

30. An optical package as in claim 28, wherein the signal processing circuits comprises a transimpedance amplifier.

31. An optical package as in claim 28, wherein a V-groove is etched into a silicon or ceramic material in the substrate to accommodate an anti-reflection coated lens for coupling the waveguide and the optical fiber.

32. An optical package as in claim 31, wherein the optical fiber tapers at a predetermined angle to facilitate coupling of the optical fiber to the photonic integrated circuit.

33. An optical package as in claim 31, wherein steps are etched into the V-groove which corresponds to steps formed on the sides of the photonic integrated circuit.

34. An optical package as in claim 28, wherein the optical package comprises a ceramic-metal hermetically sealed package.

* * * * *